United States Patent [19]
Hamada et al.

[11] Patent Number: 5,529,853
[45] Date of Patent: Jun. 25, 1996

[54] ORGANIC ELECTROLUMINESCENT ELEMENT

[75] Inventors: Yuji Hamada; Takeshi Sano; Masayuki Fujita; Takanori Fujii; Yoshitaka Nishio; Kenichi Shibata, all of Osaka, Japan

[73] Assignee: Sanyo Electric Co., Ltd., Osaka, Japan

[21] Appl. No.: 203,942

[22] Filed: Mar. 1, 1994

[30] Foreign Application Priority Data

Mar. 17, 1993 [JP] Japan ..................................... 5-057468
Mar. 25, 1993 [JP] Japan ..................................... 5-067002
Mar. 25, 1993 [JP] Japan ..................................... 5-067003

[51] Int. Cl.$^6$ ..................................................... H05B 33/14
[52] U.S. Cl. .......................... 428/690; 428/691; 428/917; 313/503; 313/504; 313/507
[58] Field of Search ..................................... 428/690, 691, 428/917; 313/503, 504, 507

[56] References Cited

U.S. PATENT DOCUMENTS

| | | | |
|---|---|---|---|
| 4,720,432 | 1/1988 | VanSlyke et al. | 428/457 |
| 5,227,252 | 7/1993 | Murayama et al. | 428/690 |
| 5,276,381 | 1/1994 | Wakimoto et al. | 313/504 |
| 5,399,936 | 3/1995 | Namiki et al. | 313/504 |

*Primary Examiner*—Charles R. Nold
*Attorney, Agent, or Firm*—Merchant, Gould, Smith, Edell, Welter & Schmidt

[57] ABSTRACT

The present invention provides an organic EL element improved in durability. The organic EL element comprises a hole-injecting electrode and an electron-injecting electrode, and at least a film made of a luminous material therebetween, wherein the luminous material is one of a metal complex polymer, an inner complex salt having two or more ligands, and 10-hydroxybenzo [h] quinoline-metal complex.

26 Claims, 4 Drawing Sheets

PENDANT STRUCTURE

L ; LEGAND OR GROUP   M ; METAL ION

PENDANT STRUCTURE

L ; LEGAND OR GROUP   M ; METAL ION

CHELATE POLYMER
(MONO DENTATE LEGEND)

L ; LEGAND OR GROUP   M ; METAL ION

CHELATE POLYMER
(MONO DENTATE LEGEND)

L ; LEGAND OR GROUP   M ; METAL ION

CHELATE POLYMER
(MULTI DENTATE LEGEND)

L ; LEGAND OR GROUP   M ; METAL ION

COORDINATION POLYMER

L ; LEGAND OR GROUP   M ; METAL ION

MOZAIC TYPE POLYMER-METAL COMPLEX

L ; LEGAND OR GROUP   M ; METAL ION

ORGANIC ELECTROLUMINESCENT ELEMENT

BACKGROUND OF THE INVENTION

1. Field of the Invention

The present invention relates to an organic electroluminescent element, and particularly, to an organic electroluminescent element improved in durability.

2. Description of the Related Arts

The rapid diversification of data processing apparatuses in recent years has invited an increasing demand for a flat-type display element that can save electricity and space compared with a CRT(cathode-ray-tube). A crystalline liquid display element and a plasma display element are typical flat-type display elements; however, another flat-type display element, a self-luminous electroluminescent element(EL element), that enables a sharp, clear display has been attracting considerable attention recently. The EL element can be made of either organic or non-organic material, and the non-organic EL element has been already put into practical use.

The non-organic EL element emits light, or luminesces, when electrons fully accelerated in an imposed electric field collide with a luminous material and excite the luminous material. However, to accelerate the electrons to a sufficient speed, a high voltage must be applied, which undesirably increases the costs of peripheral apparatuses. On the other hand, the organic EL element luminesces when charges, or namely holes and electrons injected from their respective electrodes, re-combine in the luminous material. Unlike the acceleration, the injection of the holes and electrons requires a low voltage. In addition, with organic compounds, a desired luminous color can be created by changing a molecular structure thereof. These are the major reasons why the organic EL elements have been attracting considerable attention as being a potential display element.

For further understanding, the organic EL element will be described more in detail. The typical organic EL element has an SH-A structure, an SH-B structure, or a DH structure. In the SH-A structure, a hole-transport layer and a luminous layer are formed, one on top of the other, between a hole-injecting electrode and an electron-injecting electrode; in the SH-B structure, the luminous layer and an electron-transport layer are formed, one on top of the other, between the hole- and electron-injecting electrodes; in the DH structure, three layers—the hole-transport, luminous, and electron-transport layers—are alternatively layered between the hole- and electron-injecting electrodes. The hole-injecting electrode is made of a material having a large work function such as gold or ITO(an oxide of In and Sn), while the electron-injecting electrode is made of a material having a small work function such as Mg. All of the hole-transport, luminous, and electron-transport layers are made of organic materials; the hole-transport layer is made of the organic material of p-type, while the electron-transport layer of n-type; the luminous layer is made of the organic material of n-type in the SH-A structure, p-type in the SH-B structure, and neutral in the DH structure. In any case, the organic EL element luminesces when the holes and electrons injected from their respective electrodes re-combine in the luminous layer and at the surface contacting with the hole- and/or electron-transport layers.

The demand for practical applications of the organic EL element has been increasing. Yet, this potential display element is now facing several problems to be solved urgently to be commercially useful : one of them is improvement in durability.

SUMMARY OF THE INVENTION

Accordingly, the present invention has an object to provide an organic EL element improved in durability.

The above object is fulfilled by an EL element comprising a hole-injecting electrode, an electron-injecting electrode, and an organic film layer including at least an organic luminous material formed between the hole- and electron-injecting electrodes, characterized in that the luminous material is a metal complex polymer.

The organic film layer may be made of a mixture of the organic luminous material and an organic hole-transport material.

The metal complex polymer used as the organic luminous material may be a compound expressed by Chemical Formula 101 and Chemical Formula 102.

Chemical Formula 101

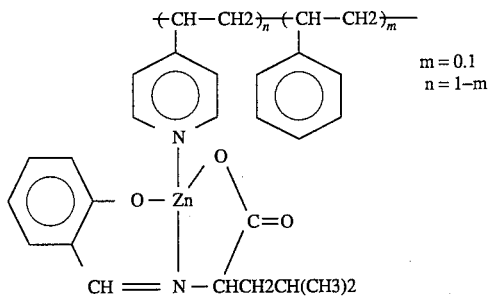

Chemical Formula 102

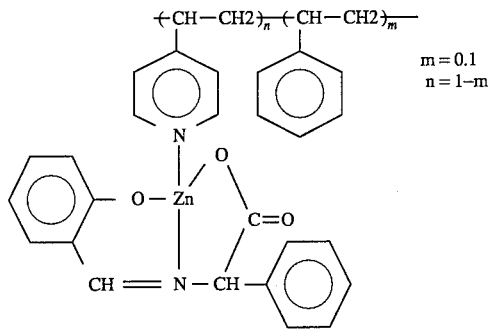

The organic hole-transport material may be a compound expressed by Chemical Formula 103.

Chemical Formula 103

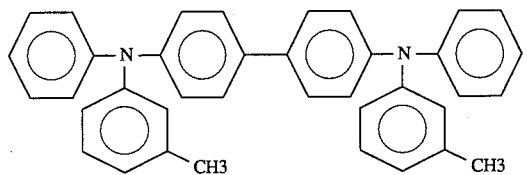

The organic film layer may consist of an organic luminous layer and an organic hole-transport layer, and the organic luminous layer may be made of the metal complex polymer used as the luminous material.

The organic film layer may consist of an organic luminous layer and an organic electron-transport layer, and the organic luminous layer may be made of the metal complex polymer used as the luminous material.

The organic film layer may consist of an organic luminous layer, an organic electron-transport layer, and a hole-transport layer, and the organic luminous layer may be made of the metal complex polymer used as the luminous material.

The above object is also fulfilled by an EL element comprising a hole-injecting electrode, an electron-injecting electrode, and an organic film layer including at least an organic luminous material formed between the hole- and electron-injecting electrodes, characterized in that the organic film layer is made of an inner complex salt having 2 or more ligands.

The organic film layer may consist of an organic luminous layer and an organic hole-transport layer, and the organic luminous layer may be made of the inner complex salt having 2 or more ligands.

The inner complex salt composing the organic luminous layer may be expressed by Chemical Formula 104.

Chemical Formula 104

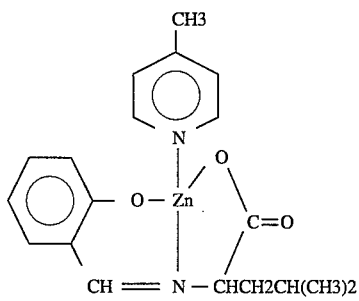

The organic hole-transport layer may be made of a diamine derivative.

The diamine derivative may be a compound expressed by Chemical Formula 105.

Chemical Formula 105

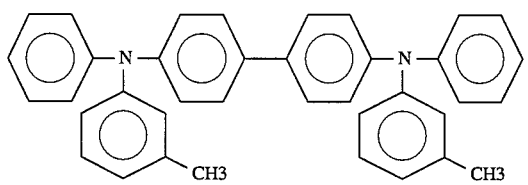

The organic film layer may consist of an organic luminous layer and an organic electron-transport layer, and the organic luminous layer may be made of the inner complex metal having 2 or more ligands.

The organic electron-transport layer may be made of any inner complex salt.

The organic film layer may consist of an organic luminous layer, an organic electron-transport layer, and an organic hole-transport layer, and the organic luminous layer may be made of the inner complex salt having 2 or more ligands.

The inner complex salt composing the organic luminous layer may be expressed by Chemical Formula 106.

Chemical Formula 106

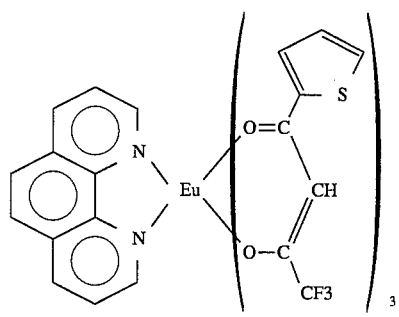

The organic hole-transport layer may be made of a diamine derivative.

The diamine derivative may be a compound expressed by Chemical Formula 107.

Chemical Formula 107

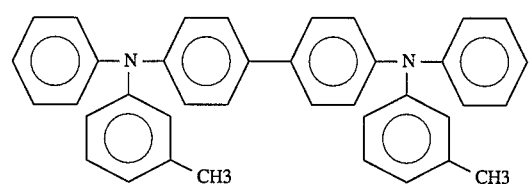

The organic electron-transport layer may be made of a compound expressed by Chemical Formula 108.

Chemical Formula 108

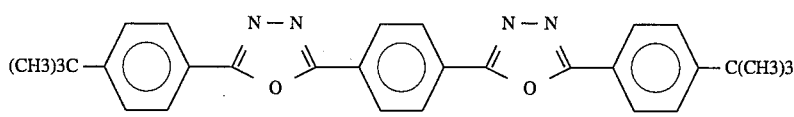

The organic electron-transport layer may be made of the inner complex salt.

The inner complex salt having 2 or more ligands composing the organic luminous layer may be a compound expressed by Chemical Formula 109.

Chemical Formula 109

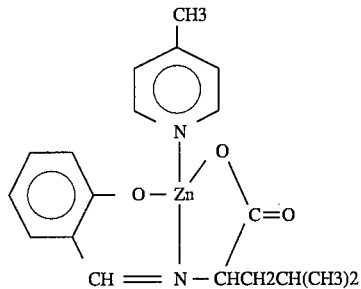

The inner complex metal composing the organic electron-transport layer may be a compound expressed by Chemical Formula 110.

Chemical Formula 110

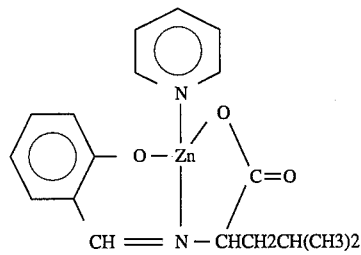

The above object is also fulfilled by an EL element comprising a hole-injecting electrode, an electron-injecting electrode, and an organic film layer including at least an organic luminous material formed between the hole and electron-injecting electrodes, characterized in that the organic film layer is made of 10-hydroxybenzo [h] quinoline—metal complex expressed by Chemical Formula 111 and Chemical Formula 112.

Chemical Formula 111

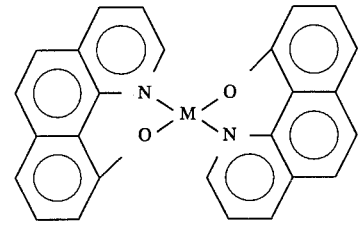

Chemical Formula 112

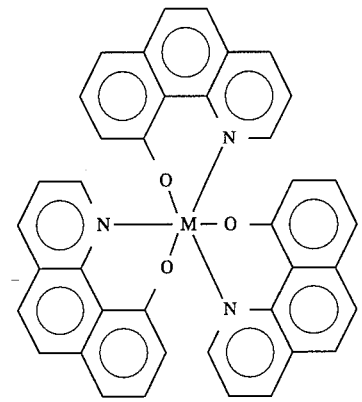

The organic film layer may consist of an organic luminous layer and an organic hole-transport layer, and the organic luminous layer may be made of the 10-hydroxybenzo [h] quinoline—metal complex.

The 10-hydroxybenzo [h] quinoline—metal complex composing the organic luminous layer may be a compound expressed by Chemical Formula 113.

Chemical Formula 113

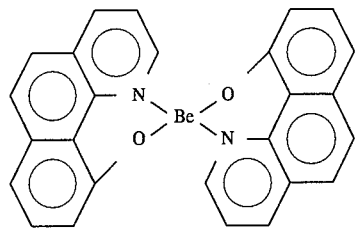

The organic hole-transport layer may be made of a diamine derivative.

The diamine derivative may be a compound expressed by Chemical Formula 114.

Chemical Formula 114

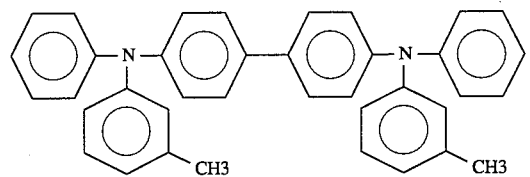

The organic luminous layer may consist of a dopant and a base material, and the 10-hydroxybenzo [h] quinoline—metal complex may serve as the dopant.

The organic luminous layer may consist of a dopant and a base material, and the 10-hydroxybenzo [h] quinoline—metal complex may serve as the base material.

The 10-hydroxybenzo [h] quinoline—metal complex serving as the base material may be a compound expressed by Chemical Formula 115.

Chemical Formula 115

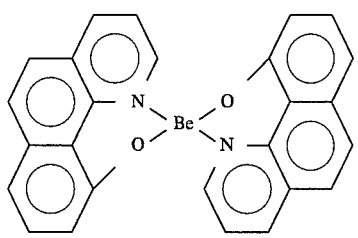

The phtaloperinone expressed by Chemical Formula 116 may serve as the dopant.

Chemical Formula 116

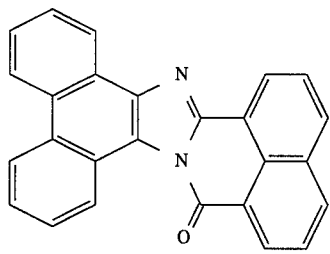

The organic hole-transport layer may be made of a diamine derivative.

The diamine derivative may be a compound expressed by Chemical Formula 117.

Chemical Formula 117

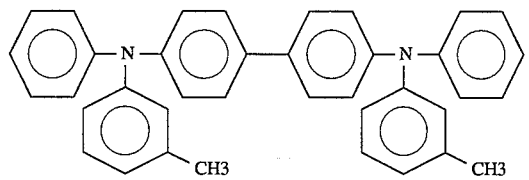

The organic film layer may consist of an organic luminous layer and an organic electron-transport layer.

The organic film layer may be made of the 10-hydroxybenzo [h] quinoline—metal complex.

The organic luminous layer may consist of a dopant and a base material, and the 10-hydroxybenzo [h] quinoline—metal complex may serve as the dopant.

The organic luminous layer may consist of a dopant and a base material, and the 10-hydroxybenzo [h] quinoline—metal complex may serve as the base material.

The organic electron-transport layer may be made of the 10-hydroxybenzo [h] quinoline—metal complex.

The organic film layer may consist of an organic luminous layer, an organic hole-transport layer, and an organic electron-transport layer.

The organic luminous layer may be made of the 10-hydroxybenzo [h] quinoline—metal complex.

The organic luminous layer may consist of a dopant and a base material, and the 10-hydroxybenzo [h] quinoline—metal complex may serve as the dopant.

The organic luminous layer may consist of a dopant and a base material, and the 10-hydroxybenzo [h] quinoline—metal complex may serve as the base material.

The organic electron-transport layer may be made of the 10-hydroxybenzo [h] quinoline—metal complex.

The 10-hydroxybenzo [h] quinoline—metal complex in the organic electron-transport layer may be a compound expressed by Chemical Formula 118.

Chemical Formula 118

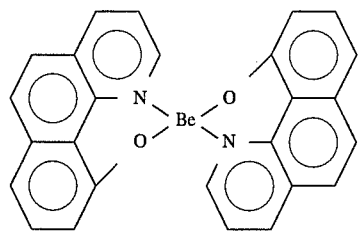

The organic hole-transport layer may be a diamine derivative.

The diamine derivative may be a compound expressed by Chemical Formula 119.

Chemical Formula 119

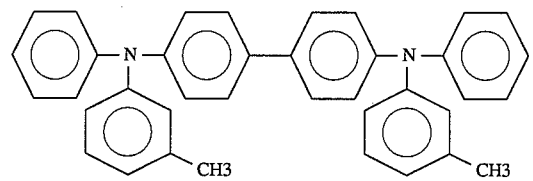

The organic luminous layer may be made of phtaloperinone expressed by Chemical Formula 120.

Chemical Formula 120

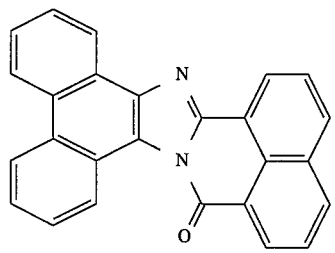

A central metal of the 10-hydroxybenzo [h] quinoline—metal complex may be selected from a group consisting of metals belonging to the second and the third groups of the periodic table.

The above object is also fulfilled by an EL element comprising an organic film layer including at least an organic luminous material between a hole-injecting electrode and an electron-injecting electrode, characterized in that the organic film layer is made of one of a metal complex polymer, an inner complex salt having 2 or more ligands, and 10-hydroxybenzo [h] quinoline—metal complex expressed by Chemical Formula 121 and Chemical Formula 122.

Chemical Formula 121

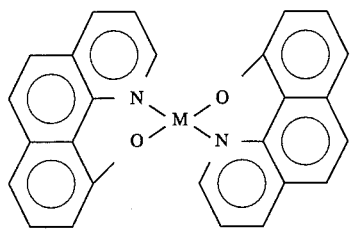

Chemical Formula 122

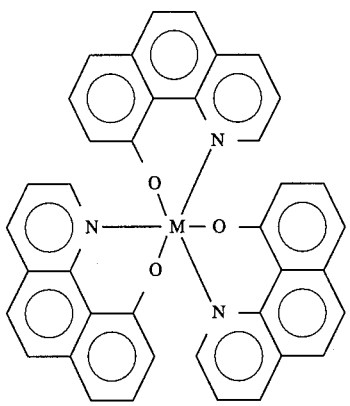

The organic film layer may be made of a mixture of an organic luminous material and an organic hole-transport material.

The organic luminous material may be the metal complex polymer.

The metal complex polymer may be a compound expressed by Chemical Formula 123 and Chemical Formula 124.

Chemical Formula 123

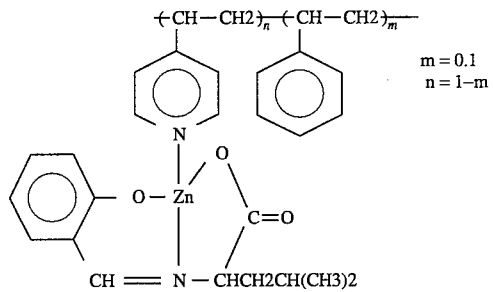

Chemical Formula 124

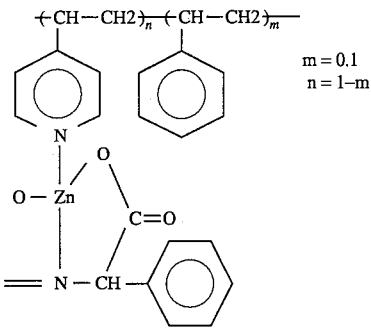

The organic hole-transport material may be a compound expressed by Chemical Formula 125.

Chemical Formula 125

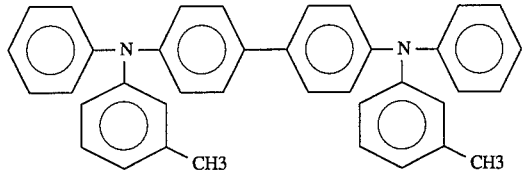

The organic film layer may consist of an organic luminous layer and an organic hole-transport layer.

The organic luminous layer may be made of one of the metal complex polymer, the inner complex salt having 2 or more ligands, and the 10-hydroxybenzo [h] quinoline—metal complex.

The organic luminous layer may be made of the metal complex polymer.

The organic luminous layer may be made of the inner complex salt having 2 or more ligands.

The inner complex salt composing the organic luminous layer may be a compound expressed by Chemical Formula 126.

Chemical Formula 126

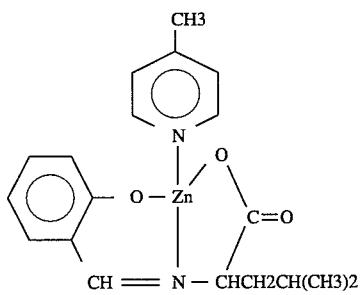

The organic hole-transport layer may be made of a diamine derivative.

The diamine derivative may be a compound expressed by Chemical Formula 127.

Chemical Formula 127

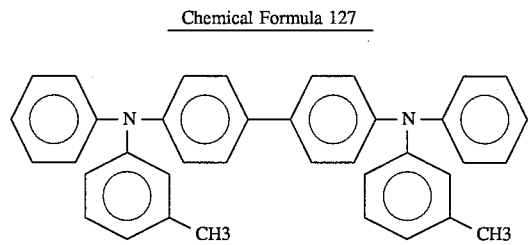

The organic luminous layer may be made of the 10-hydroxybenzo [h] quinoline—metal complex.

The 10-hydroxybenzo [h] quinoline—metal complex composing the luminous layer may be a compound expressed by Chemical Formula 128.

Chemical Formula 128

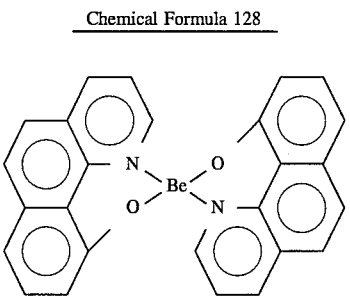

The organic hole-transport layer may be made of a diamine derivative.

The diamine derivative may be a compound expressed by Chemical Formula 129.

Chemical Formula 129

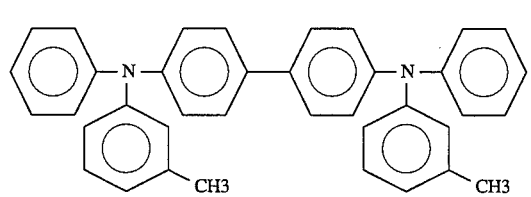

The organic luminous layer may consist of a dopant and a base material, and the 10-hydroxybenzo [h] quinoline—metal complex may serve as the dopant.

The organic luminous layer may consist of a dopant and a base material, and the 10-hydroxybenzo [h] quinoline—metal complex may serve as the base material.

The 10-hydroxybenzo [h] quinoline—metal complex serving as the base material may be a compound expressed by Chemical Formula 130.

Chemical Formula 130

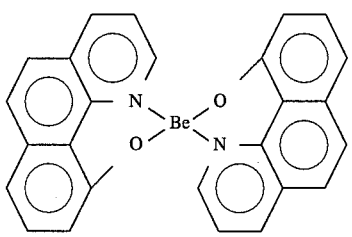

Phtaloperinone expressed by Chemical Formula 131 may serve as the dopant.

Chemical Formula 131

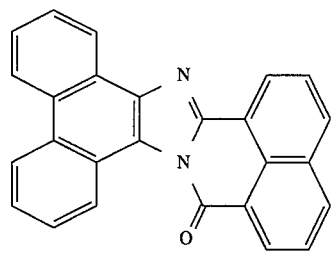

The organic hole-transport layer may be made of a diamine derivative.

The diamine derivative may be a compound expressed by Chemical Formula 132.

Chemical Formula 132

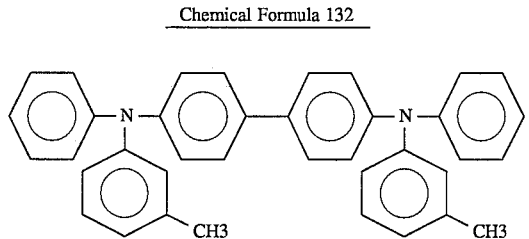

The organic film layer may consist of an organic luminous layer and an organic electron-transport layer.

The organic luminous layer may be made of one of the metal complex polymer, the inner complex metal having 2 or more ligands, and the 10-hydroxybenzo [h] quinoline—metal complex.

The organic luminous layer may be made of the metal complex polymer.

The organic luminous layer may be made of the inner complex salt having 2 or more ligands.

The organic electron-transport layer may be made of any inner complex salt.

The organic luminous layer may be made of the 10-hydroxybenzo [h] quinoline—metal complex.

The organic luminous layer may consist of a dopant and a base material, and the 10-hydroxybenzo [h] quinoline—metal complex may serve as the dopant.

The organic luminous layer may consist of a dopant and a base material, and the 10-hydroxybenzo [h] quinoline—metal complex may serve as the base material.

The organic electron-transport layer may be made of the 10-hydroxybenzo [h] quinoline—metal complex.

The organic film layer may consist of an organic luminous layer, an organic electron-transport layer, and an organic hole-transport layer.

The organic luminous layer may be made of one of the metal complex polymer, the inner complex salt having 2 or more ligands, and the 10-hydroxybenzo [h] quinoline—metal complex.

The organic luminous layer may be made of the metal complex polymer.

The organic luminous layer may be made of the inner complex salt having 2 or more ligands.

The inner complex salt composing the organic luminous layer may be a compound expressed by Chemical Formula 133.

Chemical Formula 133

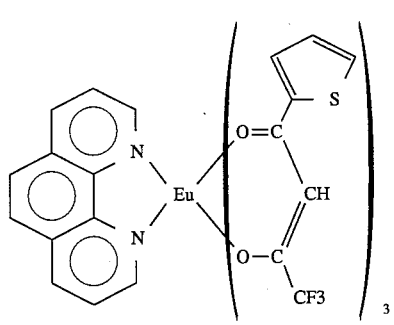

The organic hole-transport layer may be made of a diamine derivative.

The diamine derivative may be a compound expressed by Chemical Formula 134.

Chemical Formula 134

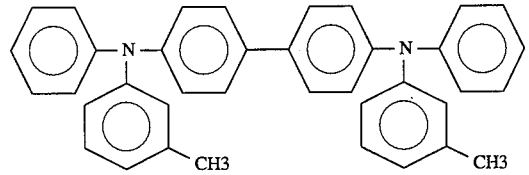

The organic electron-transport layer may be made of a compound expressed by Chemical Formula 135.

Chemical Formula 135

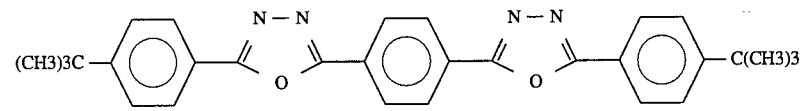

The organic electron-transport may be made of the inner complex salt.

The inner complex salt may be a compound expressed by Chemical Formula 136.

Chemical Formula 136

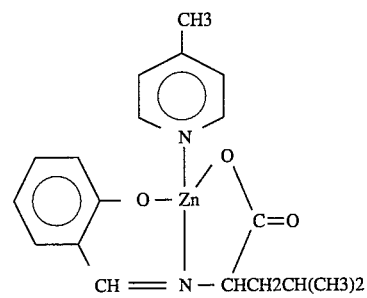

The inner complex salt may be a compound expressed by Chemical Formula 137.

Chemical Formula 137

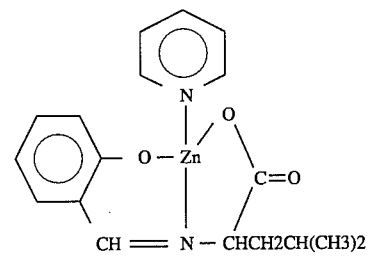

The organic hole-transport layer may be made of a diamine derivative.

The diamine derivative may be a compound expressed by Chemical Formula 138.

Chemical Formula 138

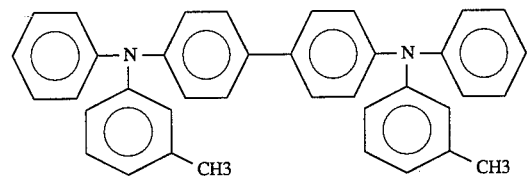

The organic luminous layer may be made of the 10-hydroxybenzo [h] quinoline—metal complex.

The organic luminous layer may consist of a dopant and a base material, and the 10-hydroxybenzo [h] quinoline—metal complex may serve as the dopant.

The organic luminous layer may consist of a dopant and a base material, and the 10-hydroxybenzo [h] quinoline—metal complex may serve as the base material.

The organic electron-transport layer may be made of the 10-hydroxybenzo [h] quinoline—metal complex.

The 10-hydroxybenzo [h] quinoline—metal complex composing the organic luminous layer may be a compound expressed by Chemical Formula 139.

Chemical Formula 139

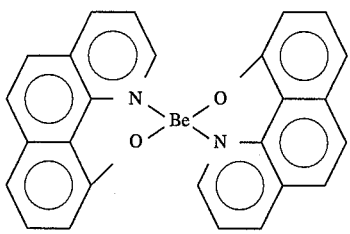

The organic hole-transport layer may be made of a diamine derivative.

The diamine derivative may be a compound expressed by Chemical Formula 140.

Chemical Formula 140

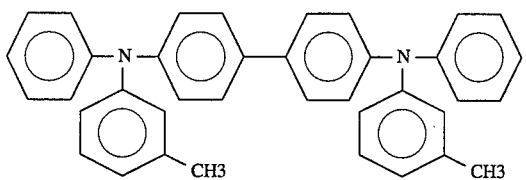

The organic luminous layer may be made of phtaloperinone expressed by chemical Formula 141.

Chemical Formula 141

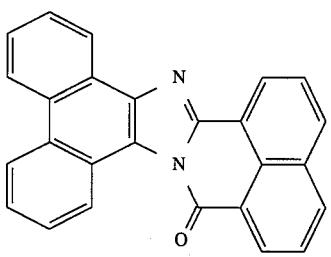

The a central metal of the 10-hydroxybenzo [h] quinoline —metal complex may be selected from a group consisting of metals belonging to the second and the third groups of the periodic table.

The metal complex polymer retains a large molecular weight and does not easily crystalize. Therefore, the film made of the metal complex polymer as the luminous material does not easily deposit crystalline. As a result, improved film forming properties, particularly in stability, are obtained and hence the durability of the organic EL element is enhanced.

Likewise, the inner complex salt having two or more ligands does not easily crystalize; moreover, it luminesces at the solid state. Therefore, the film made of the inner complex salt used as the luminous material does not easily deposit crystalline, and thus enhancing the durability of the organic EL elements as well.

In addition, when the electron-transport layer is also made of any inner complex salt, the electron-transport layer and luminous layer have similar molecular structures. Therefore, the surfaces of these two layers fit smoothly, which contributes to enhancing luminous characteristics.

Also, given that 10-hydroxybenzo [h] quinoline-metal complex luminesces at the solid state and retains an excellent fluorescence yield, the 10-hydroxybenzo [h] quinoline-metal makes an ideal luminous layer that luminesces efficiently. Further, given that 10-hydroxybenzo [h] quinoline-metal complex retains excellent electron-transport properties, it can be used for the electron-transport layer and the basic material for the luminous layer. The resulting organic El element exhibits high luminance as well.

As has been stated, when the luminous layer luminesces efficiently, retaining a high luminance at a lower voltage and a lower current density, physical load is decreased, which enhances the durability of the resulting organic EL element.

BRIEF DESCRIPTION OF THE DRAWINGS

These and other objects, advantages and features of the invention will become apparent from the following description thereof taken in conjugation with the accompanying drawings which illustrate specific embodiments of the invention. In the drawings.

DESCRIPTION OF PREFERRED EMBODIMENTS

FIRST EMBODIMENT

A metal complex polymer, which retains a large molecular weight and hence does not easily crystalize, is used as a luminous material in the first embodiment.

EXAMPLE 1

Figure 1:
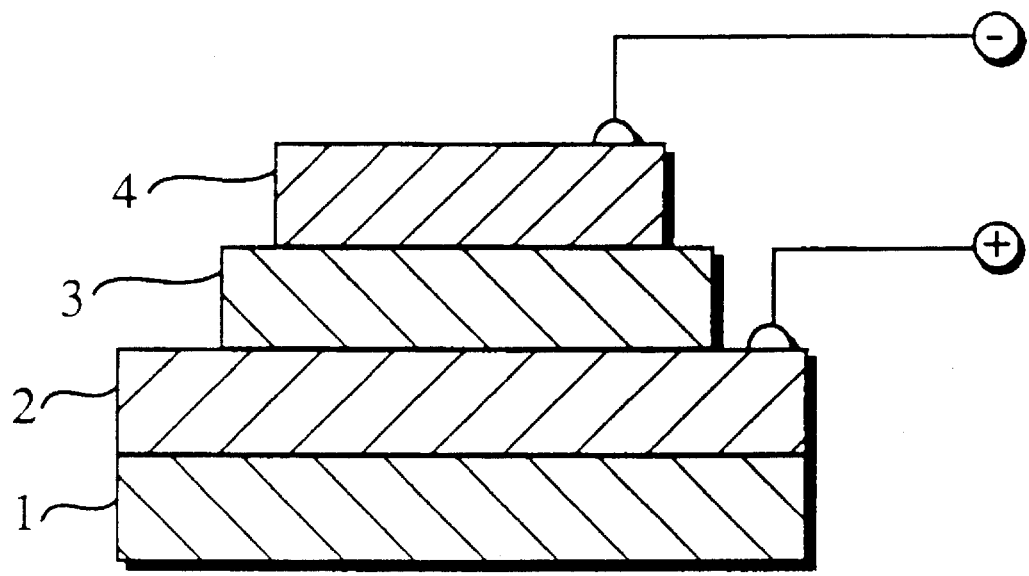
FIG. 1 is a sectional view of an organic EL element in accordance with the first embodiment of the present invention.

FIG. 1 is a sectional view of an organic EL element in accordance with the first embodiment. On a glass substrate 1, a hole-injecting electrode 2 (1000 Å in thickness) is placed, on top of which an organic luminous layer 3 (1000 Å) and further an electron-injecting electrode 4 (2000 Å) are placed.

The hole-injecting electrode 2 is made of ITO(an oxide of In and Sn). The organic luminous layer 3 is made of a mixture of a luminous material and a material transporting holes; the mixture contains thirty per cent hole-transport material by weight. The luminous material is a metal complex polymer, PSPy-sal-leu-Zn, expressed by Chemical Formula 1 below, while the hole-transport material is a diamine derivative(TPD) expressed by Chemical Formula 2 below. The electron-injecting electrode 4 is made of an Mg-In alloy in the ratio of 10 : 1.

Chemical Formula 1

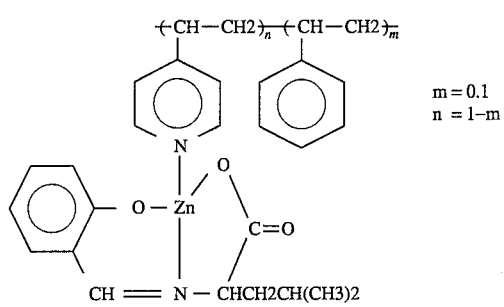

m = 0.1
n = 1−m

Chemical Formula 2

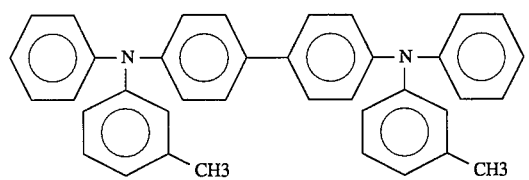

Firstly, the explanation of a process for producing the luminous material, PPSy-sal-leu-Zn emitting strong blue light, will be given.

To begin with, 2 g of PSPy was dissolved in 100 ml of methanol. Then, 1 mmol of DL leucine(α-amino acid) was added to this reaction system and dissolved with slight heat. Further, 1 mmol of salicylaldehyde was added, and the reaction system was vigorously stirred. Subsequently, 30 ml of methanol solution containing 1 mmol of zinc acetate was added, and the reaction system was stirred for 2 hours at room temperature. As a result, the metal complex polymer, PPSy-sal-leu-Zn, appeared.

Secondly, the explanation of a process for producing the organic EL element of the first embodiment will be given.

A film of ITO, which serves as the hole-injecting electrode 2, was formed on the glass substrate 1, thence washed with a neutral detergent and rinsed with water, and further dipped in acetone and ethanol, each for 20 minutes, for ultrasonic rinse. Then, the substrate 1 with the hole-injecting electrode 2 was dipped in boiling ethanol for 1 minute and immediately dried with air blow. Methanol solution containing both PSPy-sal-leu-Zn of the luminous material and TPD(30 wt %) of the hole-transport material was dropped onto the hole-injecting electrode 2 to form an even film thereon by the spin-coating technique; the film thus formed serves as the organic luminous layer 3. When the film was dried completely, the electron-injecting electrode 4 of Mg-In alloy was formed by vacuum evaporation coating on top of the organic luminous layer 3. The conditions for the vacuum evaporation coating were: the degree of vacuum at $1 \times 10^6$ Torr, the temperature of the glass substrate 1 at 20° C., and the evaporation coating speed at 3 Å/sec.

The organic EL element produced in this way is referred to as ($a_1$) element hereinafter.

EXAMPLE 2

An organic EL element was produced in the same way as EXAMPLE 1 except that PSPy-sal-phgly-Zn expressed by Chemical Formula 3 was used instead of PSPy-sal-leu-Zn as the luminous material.

Chemical Formula 3

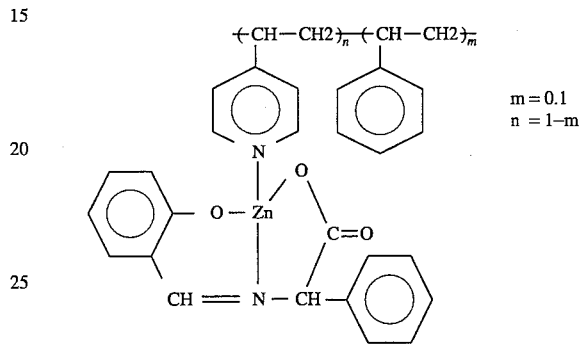

m = 0.1
n = 1−m

PSPy-sal-phgly-Zn was produced in the same way as PSPy-sal-leu-Zn except that phenylglycine was used as the α-amino acid instead of DL leucine.

The organic EL element produced in this way is referred to as ($a_2$) element.

To evaluate the characteristics of ($a_1$) and ($a_2$) elements, following two experiments were carried out.

EXPERIMENT 1

The luminous characteristics of ($a_1$) and ($a_2$) elements were evaluated, and the result is set forth in Table 1 below with the required voltage and current density.

TABLE 1

| ELEMENT | VOLTAGE (V) | CURRENT DENSITY (V/cm$^2$) | LUMINANCE (cd/m$^2$) | PEAK WAVE LENGTH (nm) | LUMINOUS COLOR |
|---|---|---|---|---|---|
| $a_1$ | 20 | 100 | 100 | 455 | BLUE |
| $a_2$ | 20 | 120 | 80 | 150 | BLUE |

EXPERIMENT 2

Further, the film stability of ($a_1$) and ($a_2$) elements was evaluated. The stability was evaluated by examining the luminance of both the elements which have been allowed to stand in dry air for a certain period. It has been confirmed that both ($a_1$) and ($a_2$) elements still emit satisfactory blue light up to 2 weeks. In comparison, a conventional organic EL element, for example, the one made of 1,1,4,4-tetraphenyl-1,3-butadiene, emits satisfactory blue light only for one day. This means that the metal complex polymer used as the luminous material retains excellent film forming properties, and thus improving durability of the organic EL element.

OTHER COMMENTS

Figure 2A:
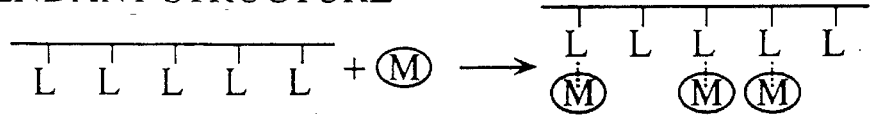
FIGS. 2A through 2G are views showing a variety of structures of a metal complex polymer.
Figure 2B:
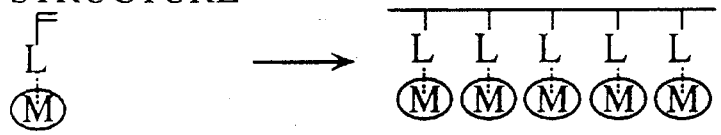
Figure 2C:
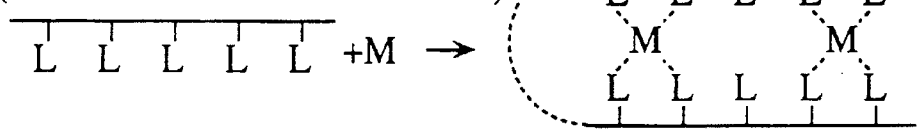
Figure 2D:
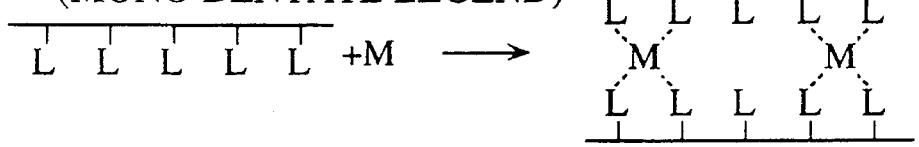
Figure 2E:
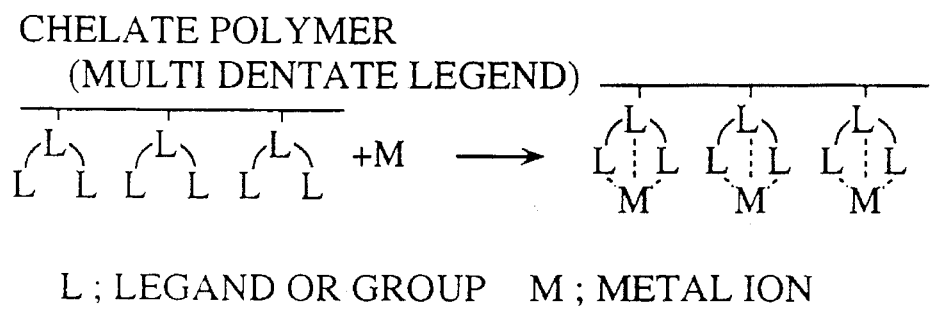
Figure 2F:
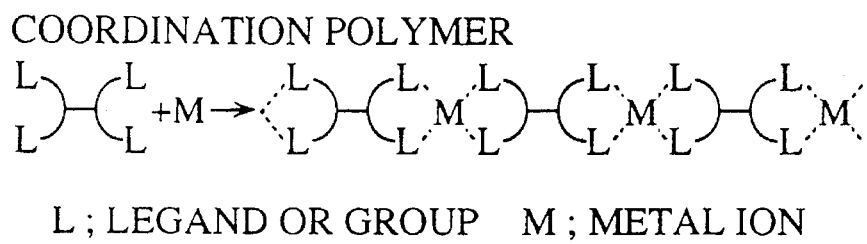
Figure 2G:
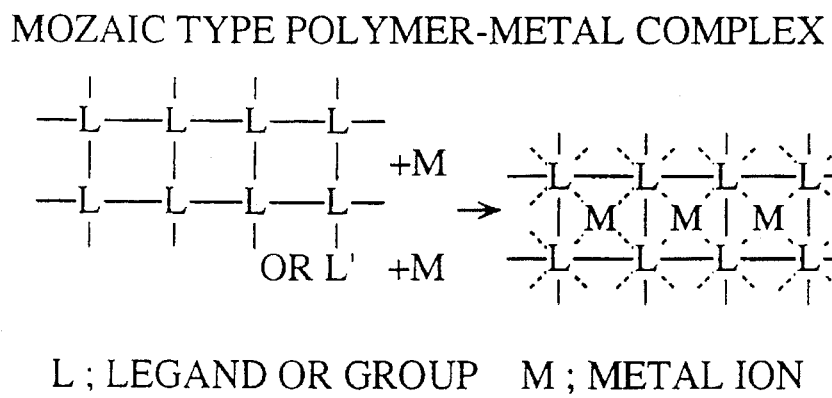

FIG. 2A shows the metal complex polymer of a pendant structure used in the first embodiment; however, the metal complex polymer can be of any structure shown in FIGS. 2B through 2G; the resulting organic EL element obtains the same effects. [For further information, see "Metal Complex Polymer", Takeo Saegusa et al, Kagaku-Dojin-Sha]

The organic hole-transport layer is not formed in this embodiment, but the organic luminous layer 3 includes the hole-transport material instead. The organic electron-transport layer and/or hole-transport layer, however, may be additionally formed between the electrodes, forming the organic EL element of the SH-A, SH-B, or DH structure.

SECOND EMBODIMENT

An inner complex salt having two or more ligands, which does not easily crystalize and luminesces at the solid state, is used as the luminous material in the second embodiment.

EXAMPLE 1

Figure 3:
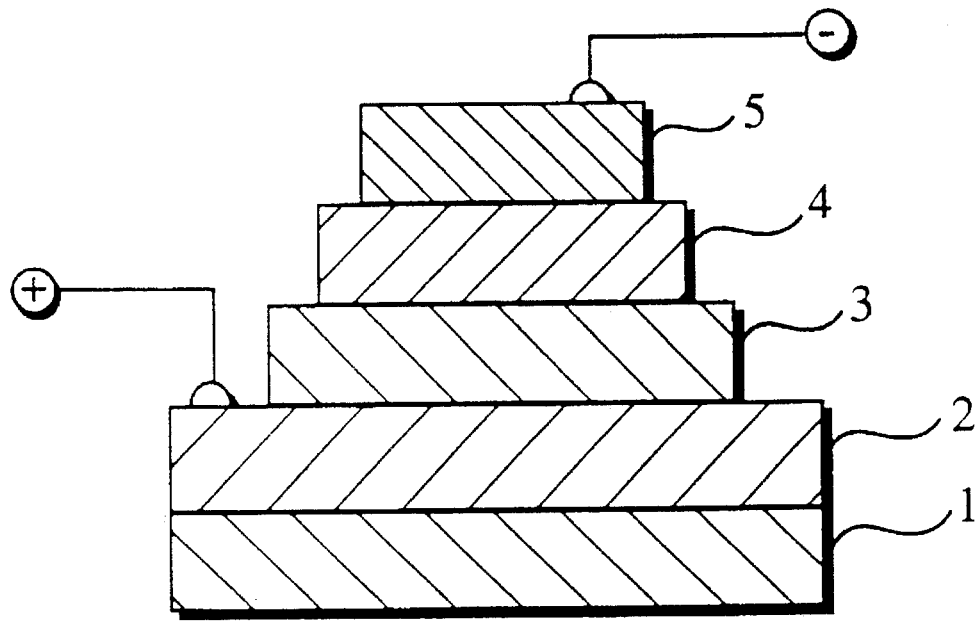
FIG. 3 is a sectional view of an organic EL element in accordance with EXAMPLE 1 of the second embodiment of the present invention.

FIG. 3 is a sectional view of an organic EL element of the SH-A structure in accordance with EXAMPLE 1. On a glass substrate 1, a hole-injecting electrode 2 (1000 Å) is placed, on top of which an organic hole-transport layer 3 (500 Å), an organic luminous layer 4 (500 Å), and further an electron-injecting electrode 4 (2000 Å) are placed.

The hole-injecting electrode 2 is made of ITO, and the organic hole-transporting layer 3 is made of TPD expressed by Chemical Formula 4 below. The organic luminous layer 4 is made of an inner complex salt, azomethine-picoline-zinc, expressed as Chemical Formula 5, and the electron-injecting electrode 5 is made of an Mg-In alloy in the ratio of 10 : 1.

Chemical Formula 4

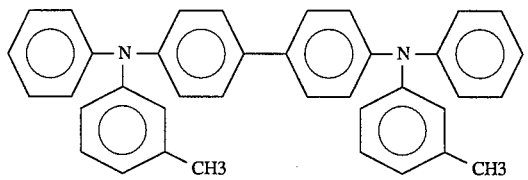

Chemical Formula 5

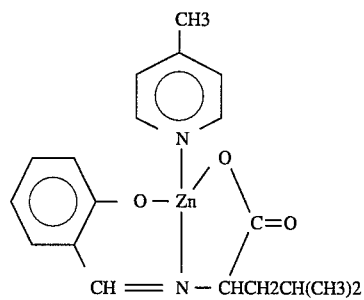

Firstly, the explanation of a process for producing the luminous material, azomethine-picoline-zinc, will be given.

To begin with, 15.25 mmol of DL leucine was dissolved in 20 ml of methanol with slight heat, and 15.25 mol of salicylaldehyde and 3 ml of picoline were added to this reaction system. Then the solution becomes turbid in yellow. Further, 30 ml of methanol solution containing 15.25 mmol of zinc acetate was added, and the reaction system was refluxed for 2 hours. As a result, the inner complex salt, azomethine-picoline-zinc emitting strong blue light, appeared. Since this inner complex salt was solvable to methanol, water was added to precipitate the inner complex salt, which was purified by sublimation.

Zinc, a central metal in the inner complex salt, has a cation with a valence of 2 and a coordination number of 4. Whereas one of the ligands, azomethine, has an anion with a valence of 2 and a donor number of 3; the other ligand, picoline, is neutral and has a donor number of 1. This structure renders the coordination number and charges of the metal complex neutral, composing the inner complex salt. Given that the inner complex salt has a low polarity and emits light in the solid state as well as being applicable to sublimation, it can be an material for the organic EL element.

Secondly, the explanation of a process for producing the organic EL element of EXAMPLE 1 of the second embodiment will be given.

A film of ITO, which serves as the hole-injecting electrode 2, was formed on the glass substrate 1, thence washed with a neutral detergent and rinsed with water, and further dipped in acetone and ethanol, each for 20 minutes for ultrasonic rinse. Then, the substrate 1 with the hole-injecting electrode 2 was dipped in boiling ethanol for 1 minute and immediately dried with air blow. Then, a film of TPD, which serves as the organic hole-transport layer 3, was formed on the hole-injecting electrode 2 by vacuum evaporation coating. Further, a film of azomethine-picoline-zinc was formed on the organic hole-transport layer 3 by the vacuum evaporation coating; the film thus formed serves as the organic luminous layer 4. Further, the electron-injecting electrode 5 made of the Mg-In alloy was formed on the organic luminous layer 4. The conditions for each vacuum evaporation coating were: the degree of vacuum at $1 \times 10^6$ Torr, the temperature of the glass substrate 1 at 20° C., and the evaporation coating speed at 2 Å/sec.

The organic EL element produced in this way is referred to as ($b_1$) hereinafter.

EXAMPLE 2

An organic EL element was produced in the same way as EXAMPLE 1 of the second embodiment except for the following:

1) the organic hole-transport layer, and organic luminous layer were of 500 Å and 100 Å in thickness, respectively, and the organic electron-transport layer of 400 Å was additionally formed by the vacuum evaporation coating.

2) Eu(TTA)$_3$(phen) expressed by Chemical Formula 6 below, (TTA represents 2-thenoyltrifluoroacetone, and phen represents 1, 10-phenanthroline), was used as the luminous material.

3) OXD-7 expressed by Chemical Formula 7 below was used as the electron-transport material.

Chemical Formula 6

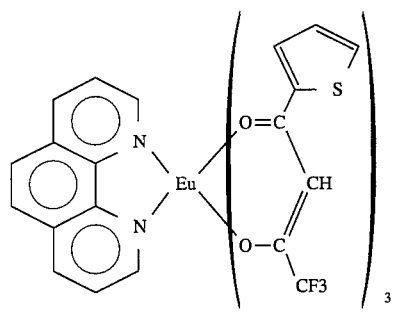

Chemical Formula 7

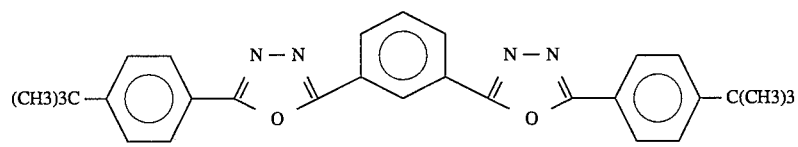

Eu(TTA)₃(phen) used as the luminous material is produced in the following way:

To begin with, 9 mmol of TTA and 3 mmol of phen were dissolved in 20 ml of ethanol at room temperature. Further, 3 ml of 1-N NaOH solution was added and this reaction system was heated at 60° C. At the same time, 3 mmol of $EuCl_3.6H_2O$ was dissolved in 10 ml of water, and the solution was dropped into the reaction system by an open system. Subsequently, the reaction system was stirred for 1 hour at 60° C. As a result, precipitates appeared. The precipitates produced in this way were filtered off by suction and purified by sublimation to produce the inner complex salt.

Europium, the central metal in this metal complex, has a cation with a valence of 3 and a coordination number of 8. Whereas one of the ligands, TTA, has an anion with a valance of 1 and a donor number of 2, and the other ligand, phen, is neutral with a donor number of 2. This structure renders the coordination number and charges of the metal complex neutral, composing the inner complex salt.

The organic EL element produced in this way is referred to as ($b_2$) hereinafter.

EXAMPLE 3

An organic EL element of the DH structure was produced in the same way as EXAMPLE 2 of the second embodiment except that the organic luminous layer is made of the inner complex salt, azomethine-picoline-zinc expressed by Chemical Formula 5, and the organic electron-transport layer is made of tBU-PBD expressed by Chemical Formula 8.

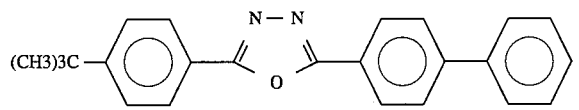

The organic EL element produced in this way is referred to as ($b_3$) hereinafter.

EXAMPLE 4

An organic EL element of the DH structure was produced in the same way as EXAMPLE 3 of the second embodiment except that the organic electron-transport layer is made of an inner complex salt, azomethine-pyridine-zinc, expressed by Chemical Formula 9.

Chemical Formula 9

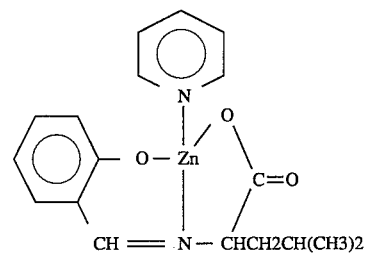

The organic EL element produced in this way is referred to as ($b_4$) element.

To evaluate the characteristics of ($b_1$) through ($b_4$) elements, the following two experiments were carried out.

EXPERIMENT 1

The luminous characteristic of ($b_1$) through ($b_4$) elements were evaluated, and the result is set forth in Table 2 with the required voltage and current density.

TABLE 2

| ELEMENT | VOLTAGE (V) | CURRENT DENSITY (V/cm$^2$) | LUMINANCE (cd/m$^2$) | PEAK WAVE LENGTH (nm) | LUMINOUS COLOR |
| --- | --- | --- | --- | --- | --- |
| $b_1$ | 18 | 150 | 800 | 450 | BLUE |
| $b_2$ | 20 | 200 | 20 | 640 | RED |
| $b_3$ | 20 | 180 | 600 | 453 | BLUE |
| $b_4$ | 20 | 130 | 900 | 450 | BLUE |

Of all the elements, the luminance comparison between ($b_3$) and ($b_4$) is noteworthy: although both use the same inner complex salt in the organic luminous layer, ($b_4$) elements exhibits a higher luminance at a lower current density than ($b_3$) element. This is because that the organic luminous layer and organic electron-transport layer are made of similar inner salt complexes in ($b_4$) element, retaining substantially the same molecular structure in both the layers. Thus, the surface of the two layers fit more smoothly than they do in ($b_3$) element, which contributes to obtaining higher luminance characteristics.

EXPERIMENT 2

The film stability of ($b_1$) through ($b_4$) elements was evaluated. The stability was evaluated by examining the luminous of each element which have been allowed to stand in dry air for a certain period. It has been confirmed that ($b_1$) element emit satisfactory light up to 5 days; ($b_2$) element 3 days; ($b_3$) element 2 days. Whereas ($b_4$) element emit satisfactory blue light up to 2 weeks. This is because that ($b_4$) element uses inner complex salt both in the organic luminous and electron-transport layers, which prevents crystalline precipitation more effectively than the other elements using the inner complex salt only in the organic luminous layer. Accordingly, ($b_4$) element emits satisfactory light for a longer period than the other elements.

The experiment shows that the inner complex salt used as the luminous material exhibits excellent film forming properties, and thus improving the durability of the organic EL element.

OTHER COMMENTS

It should be noted that the kinds of ligands and the number of the ligands of inner complex salt are not limited to a range specified in this embodiment. Also, the organic EL element of this embodiment can be formed in the SH-B structure besides the SH-A structure and DH structure.

THIRD EMBODIMENT 10-hydroxybenzo [h] quinoline-metal complex, which luminesces at the solid state and retains an excellent fluorescence yield, is used as the luminous material in the third embodiment.

EXAMPLE 1

Figure 4:
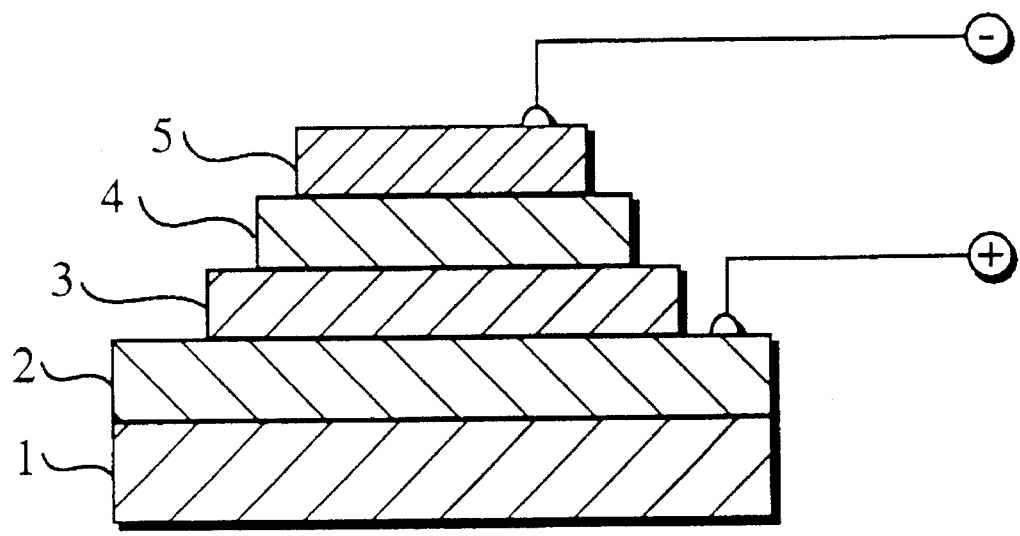
FIG. 4 is a sectional view of an organic EL element in accordance EXAMPLES 1, 2 with the third embodiment of the present invention.

FIG. 4 is a sectional view of an organic EL element of the SH-A structure in accordance with EXAMPLES 1, 2 of the third embodiment. On a glass substrate 1, a hole-injecting electrode 2 (1000 Å) is placed, on top of which an organic hole-transport layer 3 (500 Å), an organic luminous layer 4 (500 Å), and further an electron-injecting electrode 5 (2000 Å) are placed.

The hole-injecting electrode 2 is made of ITO, and the organic hole-transport layer 3 is made of TPD expressed by Chemical Formula 10 below. The organic luminous layer 4 is made of 10-hydroxybenzo [h] quinoline-beryllium complex(Bebq$_2$) expressed by Chemical Formula 11 below, and the electron-injecting electrode 5 is made of an Mg-In alloy in the ratio of 10 : 1.

Chemical Formula 10

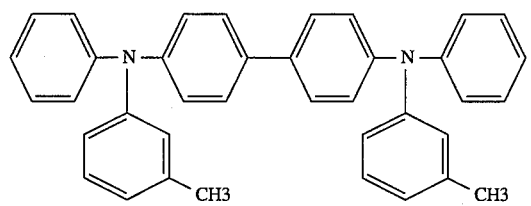

Chemical Formula 11

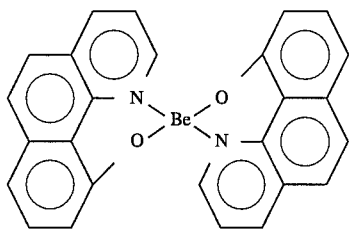

Firstly, the explanation of a process for producing the luminous material of EXAMPLE 1 of the third embodiment will be given.

To begin with, 1.53 g(7.84 mmol) of 10-hydroxybenzo [h] quinoline was dissolved in 40 ml of mixed solution of methanol and ethanol in a flask with heat to produce alcoholic quinoline solution; the ratio of methanol to ethanol was 1 : 1. Then, 0.69 g(3.92 mmol) of BeSo$_4$.4H$_2$O was dissolved in 100 ml of pure water in another flask to produce beryllium solution. Beryllium solution was gradually added to alcoholic quinoline solution while being stirred, then a substance emitting strong blue-green light appeared. To fully precipitate the substance, the pH of the solution was adjusted to mild alkaline from neutral by adding 1N NaOH solution. The precipitates were filtered off by suction and dried for 2 hours at 80° C. with heat, and sublimated by the train sublimation technique using a sublimation-purification unit. [For further information, see the paper of H. J. Wagner, R. O. Loutfy, C. K. Hsiao, J. Mater, Sci., 17, 2781(1982)] It is confirmed that the crystallites of the luminous material thus produced emit strong blue-green light having a peak wave length of 510 nm.

The organic EL element was produced in the same way as EXAMPLE 1 of the second embodiment except that Bebq$_2$ was used instead of azomethine-picoline-zinc.

The organic EL element produced in this way is referred to as ($c_1$) element hereinafter.

To make the improvement of the present invention obvious, a comparative example is produced.

COMPARATIVE EXAMPLE 1

An organic EL element of the SH-A structure was produced in the same way as the EXAMPLE 1 of the third embodiment except that 8-hydroxyquinoline-alminium complex($Alq_3$) expressed by Chemical Formula 12 below was used instead of $Bebq_2$.

Chemical Formula 12

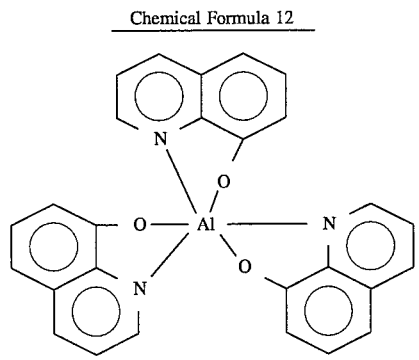

The organic EL element produced in this way is referred to as ($x_1$) element hereinafter.

To evaluate the characteristics of ($c_1$) and ($x_1$) element, the following experiment was carried out.

EXPERIMENT 1

The luminous characteristics of ($c_1$) and ($x_1$) elements were evaluated, and the result is set forth in Table 3 with the required voltage and current density.

TABLE 3

| ELEMENT | VOLTAGE (V) | CURRENT DENSITY (V/cm$^2$) | LUMINANCE (cd/m$^2$) | PEAK WAVE LENGTH (nm) | LUMINOUS COLOR |
|---|---|---|---|---|---|
| $c_1$ | 19 | 595 | 18620 | 516 | GREEN |
| $x_1$ | 20 | 600 | 14000 | 525 | GREEN |

Table 3 shows that ($c_1$) element exhibits an excellent luminance at a lower voltage, proving itself to be highly efficient compared with ($x_1$) element.

The maximum luminance of ($x_1$) element, 14000 cd/cm$^2$, is also excellent compared with a typical organic EL element; however, ($c_1$) exhibits a far more better value, 18620 cd/cm$^2$.

EXAMPLE 2

An organic EL element was produced in the same way as EXAMPLE 1 of the third embodiment except that the organic luminous layer 4 additionally contains phtaloperinone which is an orange fluorescent pigment expressed as Chemical Formula 13. The ratio of $Bebq_2$ to phtaloperinone was 100 : 2.

Chemical Formula 13

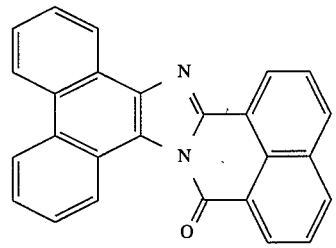

The organic EL element produced in this way is referred to as ($c_2$) element.

Also, to make the improvement of the present invention obvious, a comparative example was produced.

COMPARATIVE EXAMPLE 2

An organic EL element was produced in the same way as EXAMPLE 2 of the third embodiment except that $Alq_3$ was used instead of $Bebq_2$.

The organic EL element produced in this way is referred to as ($x_2$) hereinafter.

To evaluate the characteristics of ($c_2$) and ($x_2$) elements, the following experiment was carried out.

EXPERIMENT 2

The luminous characteristics of ($c_2$) and ($x_2$) elements were evaluated, and the result is set forth in Table 4 with the required voltage and current density.

TABLE 4

| ELEMENT | VOLTAGE (V) | CURRENT DENSITY (V/cm$^2$) | LUMINANCE (cd/m$^2$) | PEAK WAVE LENGTH (nm) | LUMINOUS COLOR |
|---|---|---|---|---|---|
| $c_2$ | 20 | 200 | 2500 | 590 | ORANGE |
| $x_2$ | 21 | 220 | 1700 | 590 | ORANGE |

Table 4 shows that ($c_2$) element does not emit green light which is inherent to $Bebq_2$, but orange light inherent to phtaloperinone instead. This means that $Bebq_2$ serves as a base material while phtaloperinone serves as a dopant in the organic luminous layer 4.

Table 4 also shows that ($c_2$) element exhibits a higher luminance at a lower voltage and a lower current density than ($x_2$) element. Thus, using $Bebq_2$ as the base material in the organic luminous layer enables an organic EL element with high luminance and efficiency.

EXAMPLE 3

An organic EL element of DH-structure was produced. On a glass substrate, an organic hole-transport layer (500 Å) is placed, on top of which an organic luminous layer (100 Å), an organic electron-transport layer (400 Å), and an electron-injecting electrode are placed one on another.

An organic EL element was produced in the same way as EXAMPLE 1 of the third embodiment except that a film of $Bebq_2$ was additionally formed on the organic luminous layer by the vacuum evaporation coating; the film thus formed serves as the organic electron-transport.

The organic EL element produced in this way is referred to as ($c_3$) element.

To make the improvement of the present invention obvious, a comparative example was produced.

COMPARATIVE EXAMPLE 3

An organic EL element was produced in the same way as EXAMPLE 3 of the third embodiment except that the organic electron-transport layer was made of 8-hydroxyquinoline-magnesium complex ($Mgq_2$) expressed by Chemical Formula 14.

Chemical Formula 14

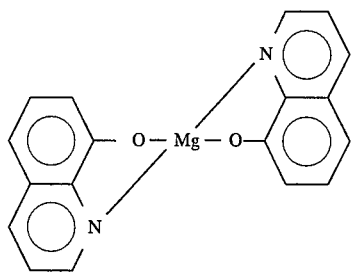

The organic EL element produced in this way is referred to as ($x_3$) hereinafter.

To evaluate the characteristics of ($c_3$) and ($x_3$) elements, the following experiment was carried out.

EXPERIMENT 3

The luminous characteristics of ($c_3$) and ($x_3$) elements were evaluated, and the result is set forth in Table 5 with the required voltage and current density.

TABLE 5

| ELEMENT | VOLTAGE (V) | CURRENT DENSITY (V/cm$^2$) | LUMINANCE (cd/m$^2$) | PEAK WAVE LENGTH (nm) | LUMINOUS COLOR |
|---|---|---|---|---|---|
| $c_3$ | 19 | 190 | 1000 | 590 | ORANGE |
| $x_3$ | 22 | 210 | 700 | 590 | ORANGE |

Table 5 shows that ($c_3$) element emits light more efficiently than ($x_3$) element.

As has been explained, by making the organic luminous layer with 10-hydroxybenzo [h] quinoline-metal complex, the organic EL element efficiently emits light, and when it does so, the physical load can be decreased, increasing the durability.

OTHER COMMENTS

It should be noted that 10-hydroxybenzo [h] quinoline—metal complex can be used as the dopant in the organic luminous layer as well.

In addition, beryllium is used as a central metal for 10-hydroxybenzo [h] quinoline-metal complex in this embodiment. However, beryllium can be replaced with any metal belonging to the second and third groups of the periodic table.

In this embodiment, the ratio of ligand to metal was 2 : 1 in 10-hydroxybenzo [h] quinoline-metal complex. However, the ratio may be 3 : 1 instead.

The detailed explanation is omitted; however, the organic luminous layer can be made of 10-hydroxybenzo [h] quinoline-metal complex in the SH-B structure and DH structure besides the SH-A structure. Likewise, the organic electron-transport layer can be made of 10-hydroxybenzo [h] quinoline-metal complex in the SH-B structure besides the DH structure.

Although the present invention has been fully described by way of example with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. An EL element comprising a hole-injecting electrode, an electron-injecting electrode, and an organic film layer including at least an organic luminous material formed between the hole and electron-injecting electrodes, characterized in that the organic film layer is made of 10-hydroxybenzo [h] quinoline—metal complex expressed by Chemical Formula 111 and Chemical Formula 112

Chemical Formula 111

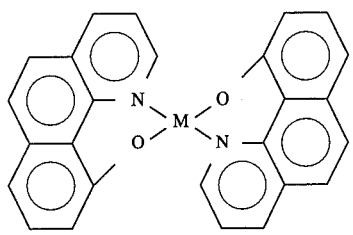

Chemical Formula 112

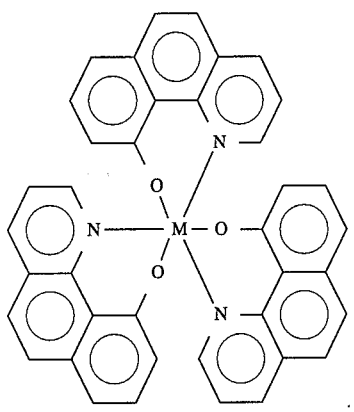

2. The EL element of claim 1, wherein the organic film layer consists of an organic luminous layer and an organic hole-transport layer, and the organic luminous layer is made of the 10-hydroxybenzo [h quinoline—metal complex.

3. The EL element of claim 2, wherein the 10-hydroxybenzo [h] quinoline—metal complex composing the organic luminous layer is a compound expressed by Chemical Formula 113

Chemical Formula 113

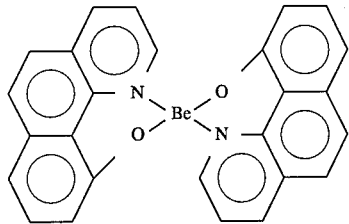

4. The EL element of claim 3, wherein the organic hole-transport layer is made of a diamine derivative.

5. The EL element of claim 4, wherein the diamine derivative is a compound expressed by Chemical Formula 114

Chemical Formula 114

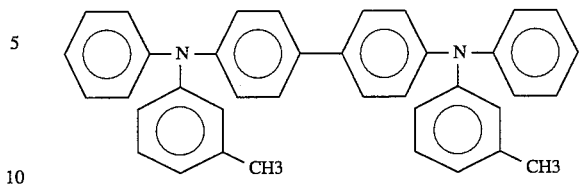

6. The EL element of claim 2, wherein the organic luminous layer consists of a dopant and a base material, and the 10-hydroxybenzo [h] quinoline—metal complex serves as the dopant.

7. The EL element of claim 2, wherein the organic luminous layer consists of a dopant and a base material, and the 10-hydroxybenzo [h] quinoline—metal complex serves as the base material.

8. The EL element of claim 7, wherein the 10-hydroxybenzo [h] quinoline—metal complex serving as the base material is a compound expressed by Chemical Formula 115

Chemical Formula 115

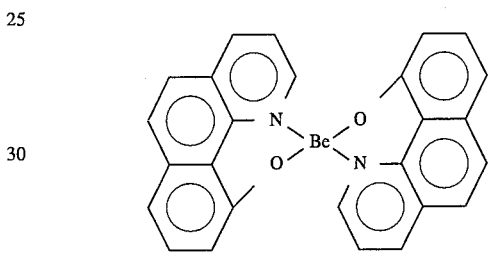

9. The EL element of claim 8, wherein phtaloperinone expressed by Chemical Formula 116 serves as the dopant Chemical Formula 116

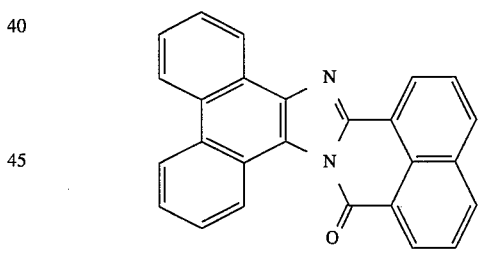

10. The EL element of claim 9, wherein the organic hole-transport layer is made of a diamine derivative.

11. The EL element of claim 10, wherein the diamine derivative is a compound expressed by Chemical Formula 117

Chemical Formula 117

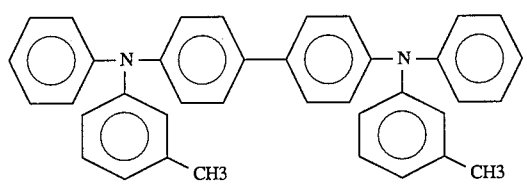

12. The EL element of claim 1, wherein the organic film layer consists of an organic luminous layer and an organic electron-transport layer.

13. The EL element of claim 2, wherein the organic film layer is made of the 10-hydroxybenzo [h] quinoline—metal complex.

14. The EL element of claim 13, wherein the organic luminous layer consists of a dopant and a base material, and the 10-hydroxybenzo [h] quinoline—metal complex serves as the dopant.

15. The EL element of claim 13, wherein the organic luminous layer consists of a dopant and a base material, and the 10-hydroxybenzo [h] quinoline—metal complex serves as the base material.

16. The EL element of claim 12, wherein the organic electron-transport layer is made of the 10-hydroxybenzo [h] quinoline—metal complex.

17. The EL element of claim 1, wherein the organic film layer consists of an organic luminous layer, an organic hole-transport layer, and an organic electron-transport layer.

18. The EL element of claim 17, wherein the organic luminous layer is made of the 10-hydroxybenzo [h] quinoline—metal complex.

19. The EL element of claim 18, wherein the organic luminous layer consists of a dopant and a base material, and the 10-hydroxybenzo [h] quinoline—metal complex serves as the dopant.

20. The EL element of claim 18, wherein the organic luminous layer consists of a dopant and a base material, and the 10-hydroxybenzo [h] quinoline—metal complex serves as the base material.

21. The EL element of claim 17, wherein the organic electron-transport layer is made of the 10-hydroxybenzo [h] quinoline—metal complex.

22. The EL element of claim 21, wherein the 10-hydroxybenzo [h] quinoline—metal complex in the organic electron-transport layer is a compound expressed by Chemical Formula 118

Chemical Formula 118

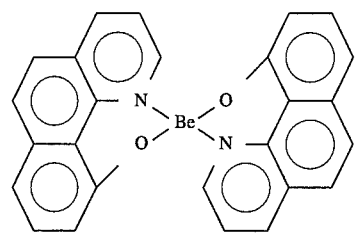

23. The EL element of claim 22, wherein the organic hole-transport layer is a diamine derivative.

24. The EL element of claim 23, wherein the diamine derivative is a compound expressed by Chemical Formula 119

Chemical Formula 119

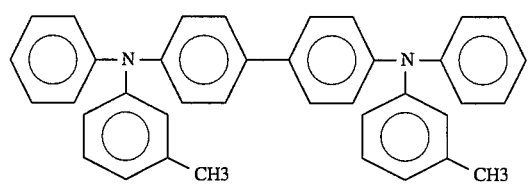

25. The EL element of claim 24, wherein the organic luminous layer is made of phtaloperinone expressed by Chemical Formula 120

Chemical Formula 120

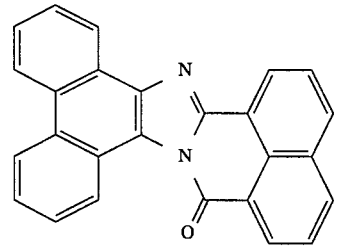

26. The EL element of claim 1, wherein a central metal of the 10-hydroxybenzo [h] quinoline—metal complex is selected from a group consisting of metals belonging to the second and the third groups of the periodic table.

* * * * *